US009425255B2

(12) United States Patent
Barraud et al.

(10) Patent No.: US 9,425,255 B2
(45) Date of Patent: Aug. 23, 2016

(54) NANOWIRE AND PLANAR TRANSISTORS CO-INTEGRATED ON UTBOX SOI SUBSTRATE

(71) Applicants: COMMISSARIAT A L'ENERGIE ATOMIQUE ET AUX ENERGIES ALTERNATIVES, Paris (FR); STMICROELECTRONICS (CROLLES 2) SAS, Crolles (FR)

(72) Inventors: Sylvain Barraud, Le Grand Lemps (FR); Yves Morand, Grenoble (FR)

(73) Assignees: Commissariat a l'energie atomique et aux energies alternatives, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/982,852

(22) Filed: Dec. 29, 2015

(65) Prior Publication Data

US 2016/0133700 A1    May 12, 2016

Related U.S. Application Data

(62) Division of application No. 14/266,999, filed on May 1, 2014, now Pat. No. 9,276,073.

(30) Foreign Application Priority Data

May 2, 2013    (FR) ...................... 13 54045

(51) Int. Cl.
*H01L 29/06*    (2006.01)
*H01L 21/84*    (2006.01)
(Continued)

(52) U.S. Cl.
CPC .......... *H01L 29/0673* (2013.01); *H01L 21/845* (2013.01); *H01L 27/1211* (2013.01); *H01L 29/0669* (2013.01); *H01L 29/413* (2013.01);
(Continued)

(58) Field of Classification Search
CPC .......................... H01L 29/413; H01L 29/0669
USPC ........................................... 257/623; 438/164
See application file for complete search history.

(56) References Cited

U.S. PATENT DOCUMENTS 6,537,894 B2    3/2003    Skotnicki et al.
6,709,982 B1    3/2004    Buynoski et al.
(Continued)

FOREIGN PATENT DOCUMENTS

WO    WO 2008/059440 A2    5/2008
WO    WO 2010/011287 A1    1/2010

OTHER PUBLICATIONS

Yang-Kyu Choi, et al, "Spacer FinFET: nanoscale double-gate CMOS technology for the terabit era" Solid-State Electronics, vol. 46 (2002), pp. 1595-1601.
(Continued)

*Primary Examiner* — Calvin Lee
(74) *Attorney, Agent, or Firm* — Oblon, McClelland, Maier & Neustadt, L.L.P.

(57) ABSTRACT

Fabrication of a microelectronic device on a semiconductor on insulator type substrate, the device being provided with a transistor of a given type, the channel structure of which is formed from semiconducting bar(s), a dielectric area different from the insulating layer of the substrate being provided to replace the insulating layer, facing the transistor channel structure, specifically for this given type of transistor.

5 Claims, 15 Drawing Sheets

(51) Int. Cl.
  *H01L 51/05*  (2006.01)
  *H01L 29/41*  (2006.01)
  *H01L 51/44*  (2006.01)
  *H01L 29/786*  (2006.01)
  *H01L 27/12*  (2006.01)
  *H01L 29/78*  (2006.01)

(52) U.S. Cl.
  CPC ........ *H01L 29/785* (2013.01); *H01L 29/78648* (2013.01); *H01L 29/78696* (2013.01); *H01L 51/057* (2013.01); *H01L 51/444* (2013.01)

(56) References Cited

U.S. PATENT DOCUMENTS

| | | | |
|---|---|---|---|
| 6,914,295 | B2 | 7/2005 | Chau et al. |
| 6,949,768 | B1 | 9/2005 | Anderson et al. |
| 7,015,147 | B2 | 3/2006 | Lee |
| 7,419,857 | B2 | 9/2008 | Choi |
| 8,492,232 | B2* | 7/2013 | Ernst ............... H01L 29/42392 257/E21.409 |
| 9,076,813 | B1 | 7/2015 | Lee |
| 9,276,073 | B2* | 3/2016 | Barraud ............ H01L 29/413 438/164 |
| 2004/0262690 | A1 | 12/2004 | Coronel et al. |
| 2011/0021026 | A1 | 1/2011 | Luning et al. |
| 2011/0108920 | A1 | 5/2011 | Basker et al. |
| 2011/0115023 | A1 | 5/2011 | Cheng et al. |
| 2011/0133167 | A1 | 6/2011 | Bangsaruntip et al. |

OTHER PUBLICATIONS

Yang-Kyu Choi, et al, "A Spacer Patterning Technology for Nanoscale CMOS", IEEE Transactions on Electron Devices, vol. 49, No. 3, (Mar. 2002), pp. 436-441.

J. Mody, et al., "3D-Carrier Profiling in FinFETs using Scanning Spreading Resistance Microscopy", Electron Devices Meeting (IEDM), 2011 IEEE International, (Dec. 5-7, 2011), pp. 6.1.1-6.1.4.

A. Keshavarzi, et al., "Architecting Advanced Technologies for 14nm and Beyond with 3D FinFET Transistors for the Future SoC Applications", Electron Devices Meeting (IEDM), 2011 IEEE International, (Dec. 5-7, 2011), pp. 4.1.1-4.1.4.

M. Lemme, et al., "Subthreshold Characteristics of p-type Triple-Gate MOSFETs", Published in: European Solid-State Device Research, 2003, ESSDERC '03, $33^{rd}$ Conference, (Sep. 16-18, 2003), pp. 123-126.

M. Lemme, et al., "Influence of channel width on n- and p-type nano-wire-MOSFETs on silicon on insulator substrate", Elsevier, Microelectronic Engineering 67-68, (2003), pp. 810-817.

Masumi Saitoh, et al., "Understanding of Short-Channel Mobility in Tri-Gate Nanowire MOSFETs and Enhanced Stress Memorization Technique for Performance Improvement", Electron Devices Meeting (IEDM), 2010 IEEE International, (Dec. 6-8, 2010), pp. 34.3.1-34.3.4.

M. Saitoh, et al., "Short-Channel Performance and Mobility Analysis of <110>- and <100>-Oriented Tri-Gate Nanowire MOSFETs with Raised Source/Drain Extensions", 2010 IEEE, 2010 Symposium on VLSI Technology Digest of Technical Papers, pp. 169-170.

M. Saitoh, et al., "Unified Understanding of Vth and Id Variability in Tri-Gate Nanowire MOSFETs", published in: VLSI Technology (VLSIT), 2011 Symposium, VLSI Technology Digest of Technical Papers, (Jun. 14-16, 2011), pp. 132-133.

Masumi. Saitoh, et al., "10nm-Diameter Tri-Gate Silicon Nanowire MOSFETs with Enhanced High-Field Transport and Vth Tunability through Thin Box", 2012 IEEE, 2012 Symposium on VLSI Technology Digest of Technical Papers, (Jun. 12-14, 2012), pp. 11-12.

C.-H. Lin, et al., "Channel Doping Impact on FinFETs for 22nm and Beyond", 2012 IEEE, 2012 Symposium on VLSI Technology Digest of Technical Papers, (Jun. 12-14, 2012), pp. 15-16.

K.-W. Ang, et al., "300mm FinFET Resuilts Utilizing Conformal, Damage Free, Ultra Shallow Junctions (Xj-5nm) Formed with Molecular Monolayer Doping Technique", Electron Devices Meeting (IEDM), 2011 IEEE International, (Dec. 5-7, 2011), pp. 35.5.1-35.5.4.

Malgorzata Jurczak, et al., "Silicon-on-Nothing (SON)—an Innovative Process for Advanced CMOS", IEEE Transactions on Electron Devices, vol. 47, No. 11, (Nov. 2000), pp. 2179-2187.

J.B. Chang, et al., "Scaling of SOI FinFETs down to Fin Width of 4 nm for the 10nm technology node", 2011 Symposium on VLSI Technology Digest of Technical Papers, (Jun. 14-16, 2011), pp. 12-13.

T. Yamashita, et al., "Sub-25nm FinFET with Advanced Fin Formation and Short Channel Effect Engineering", 2011 Symposium on VLSI Technology Digest of Technical Papers, (Jun. 14-16, 2011), pp. 14-15.

\* cited by examiner

NANOWIRE AND PLANAR TRANSISTORS CO-INTEGRATED ON UTBOX SOI SUBSTRATE

CROSS REFERENCE TO RELATED PATENT APPLICATIONS

The present application is a divisional application of U.S. application Ser. No. 14/266,999, filed May 1, 2014, now U.S. Pat. No. 9,276,073 issued Mar. 1, 2015, the entire contents of which are incorporated herein by reference. U.S. application Ser. No. 14/266,999 claims foreign priority to French Application No. 13 54045, filed May 2, 2013.

DESCRIPTION

1. Technical Field

This invention relates to the field of microelectronics and is particularly applicable to producing of transistors for which the channel semiconducting structure is in the form of a plurality of parallel adjacent semiconducting nanowires on a semiconductor on insulator type substrate.

In particular, it can be used to make different types of transistors on a single semiconductor on insulator substrate in which one or several regions have been modified.

The invention is applicable for example to the use of fin-FET or trigate type transistors co-integrated on the same semiconductor on insulator substrate as FDSOI type planar gate transistors.

2. Prior Art

New transistor structures for which the channel is formed from one or several parallel semiconducting bars have been developed, particularly to increase the integration density in comparison with conventional MOSFET transistors.

For example, transistors of the type commonly called "fin-FET" comprise a channel formed from one or several semiconducting bars or fins in the form of adjacent nanowires that extend parallel to the substrate on which this or these nanowires are arranged.

Document "Spacer FinFET: nanoscale double-gate CMOS technology for the terabit era" by Choi et al., Solid-State Electronics, vol. 46, pp. 1595-1601, 2002) gives an example disclosure of a method for making a finFET transistor with small nanowires obtained by etching through a mask in which the patterns called "spacers" are formed by conforming deposition of a layer in contact with a sacrificial pad that is thinner than the critical dimension of the pad.

The gate structure of nanowire transistors is usually nonplanar and is designed so as to encase the nanowire(s), and particularly to extend over the side faces of the nanowires.

For example, the transistor of the type commonly called "Trigate" has a partially encasing gate structure around one or several nanowires arranged in contact with the flanks of the nanowire(s) and on their top face.

Document U.S. Pat. No. 6,914,295 B2 discloses an example of a method for making such a tri-Gate transistor.

Unlike a planar gate structure for which the gate extends only in a direction parallel to the channel, the gate-channel contact surface is improved which has the main advantage of reducing leakage currents when the transistor is in the blocked or "off" state. Thus, shorter gate lengths can be obtained than with planar gate architectures, while maintaining exactly the same electrical performances.

Furthermore, in the field of planar gate structure transistors, transistors of the type commonly called FDSOI (FDSOI for "Fully Depleted Silicon On insulator"), made on a semiconductor on insulator type substrate have the advantage over conventional MOS transistors that they can have a threshold voltage $V_T$ that can be modulated by electrostatic coupling also referred to as capacitive coupling.

This is done by varying the potential applied to the semiconducting support layer of the semiconductor on insulator type substrate on which these transistors are formed.

The coupling between this support layer and the transistor channel can be obtained by using an SOI substrate with a thin or ultra-thin layer of buried oxide (BOX).

However, this insulating layer may not be suitable for nanowire transistors.

The problem arises of finding a new method for making a transistor structure with semiconducting nanowires that is capable of co-integrating this structure on a semiconductor on insulator type substrate, with one or several transistors of a different type and particularly planar transistors.

PRESENTATION OF THE INVENTION

This invention makes use of a microelectronic device on a semiconductor on insulator type substrate including the formation of at least one channel structure of at least one first type of transistor, said structure being formed by one or several adjacent semiconducting bars, on a given dielectric area that is different from the remainder of the insulating layer of the substrate.

A semiconductor on insulator type substrate means a substrate with a semiconducting support layer, an insulating layer on said support layer and said thin semiconducting layer being supported on said insulating layer.

To obtain the given dielectric area, the material in said insulating layer of the substrate is firstly removed in a region in which said semiconducting bars are located.

A replacement by a given dielectric material can then be made so as to make a replacement dielectric area different from the remainder of said insulating layer of the substrate, the thickness and composition of which may be adapted specifically to the first type of transistor.

Thus, this invention relates to a method for making a microelectronic device including steps as follows:

a) make one or several semiconducting bars, designed to form at least one transistor channel or several transistor channels of a first type, by etching through an opening in a first mask facing a given region of a thin semiconducting layer of a semiconductor on insulator substrate, b) remove an area from said insulating layer of said substrate in extension of said opening so as to expose said semiconducting bars.

The semiconducting bars are also called "nanowires" when their critical dimension is less than 1 µm.

The insulating layer is based on a material with a first dielectric constant $k_1$. According to one possible embodiment, the material of the insulating layer may be $SiO_2$.

Advantageously, the method also comprises a step after step b) consisting of depositing a given dielectric material facing said opening to replace said area of said insulating layer removed in b). The thickness and/or composition of this replacement dielectric material are different from the thickness and/or composition of said area of said insulating layer removed in step b).

Thus, a specific dielectric area is formed facing the semiconducting bars different from the initial insulating layer of the semiconductor on insulator type substrate.

Advantageously, the given dielectric replacement material is a dielectric material with a composition and thickness that are selected to enable electrostatic or capacitive coupling between said support layer and said conducting bars.

According to one possible embodiment of the method, the given dielectric replacement material has a dielectric constant $k_2$ such that $k_2 > k_1$.

In particular, this given replacement dielectric material may be $Si_xN_y$, or a "high-k" type dielectric.

Advantageously, at least one isolation trench may be made between said given region and said other region in the thin semiconducting layer. This isolation trench may be of the STI (Shallow Trench Isolation) type.

Advantageously, the semiconducting bar(s) is (are) formed in step a) by etching the thin semiconducting layer through one or several blocks of a second mask partially covering said opening of said first mask and made by:

forming one or several sacrificial pads with critical dimension $Dc_1$ given on said given region,
forming one or several blocks with critical dimension $Dc2 < Dc1$ in contact with the flanks of said pad(s),
removing said sacrificial pad(s).

Thus, small semiconducting bars can be made.

The method may further include deposition of a hard mask layer on said first mask and in said opening, before production of said mask.

In this case, production of said second mask may also include anisotropic etching of the hard mask layer through said blocks with critical dimension Dc2.

The blocks of the second mask may have one end supported on the first mask and that is outside a region delimited by said opening of said first mask. This arrangement can be used to facilitate subsequent removal of the second mask.

According to one possible embodiment of the method, in step b) another area of said insulating layer facing another region of said thin semiconducting layer may be protected by said first mask and kept.

Facing this other area, at least one transistor of a second type, different from said first type, may be provided.

Said other area of said insulating layer that was kept may have a thickness and a composition adapted to the second type of transistor.

Thus, according to the invention, co-integration of transistors of the first type for which the channel is formed by adjacent parallel bars facing said specific dielectric area, and at least one transistor of a second type, different from the first type, may be made facing said intact conserved area of said insulating layer.

The transistor of the first type may for example be a tri-gate or finFET type transistor with an encasing gate structure, while the transistor(s) of the second type may for example be made from MOS transistors with a planar gate structure.

Advantageously, said insulating layer of the substrate may be thin or ultra-thin with a thickness of less than 20 nm. Thus, according to one possible embodiment, the transistor(s) of the second type may for example be of the FDSOI type.

According to another aspect, this invention also relates to a microelectronic device provided with:

a substrate comprising a thin semiconducting layer supported on an insulating layer, said insulating layer being supported on a semiconducting support layer,
at least one first transistor of a first type comprising a region adapted to form a channel formed from one or several adjacent bars in and/or on said thin semiconducting layer and an encasing gate arranged on said bars and around the lateral faces of said bars, said channel of said first transistor being arranged above and facing a modified area of the substrate, or on a modified area of the substrate or on a modified area of the substrate based on a dielectric material different from the material in the insulating layer.

The dielectric constant $k_2$ of the given dielectric material in the modified area of the substrate may be such that $k_2 > k_1$ where $k_1$ is the dielectric constant of the material of said insulating layer.

The given dielectric material of the modified area of the substrate may also have a composition and thickness selected to enable capacitive coupling between said channel of said first transistor and said semiconducting support layer.

This in particular makes it possible to modulate the threshold voltage of said first transistor.

The insulating layer of the substrate may be based on $SiO_2$ and its thickness may be less than 25 nm or 20 nm. Thus, the substrate may have an UTBOX type of insulating layer.

Advantageously, the device may comprise at least one second transistor, the channel area of which is formed in a region of the thin semiconducting layer arranged on and in contact with said insulating layer of the substrate.

The composition and thickness of the insulating layer may be designed to enable capacitive coupling between the channel of said second transistor and said semiconducting support layer of said substrate.

Advantageously, the device may further comprise at least one other transistor, in which the channel area is formed in a semiconducting region arranged on and in contact with the semiconducting support layer of the substrate.

BRIEF DESCRIPTION OF THE DRAWINGS

This invention will be better understood after reading the description of example embodiments given purely for information and that are in no way limitative, with reference to the appended drawings in which.

Identical, similar or equivalent parts of the different figures have the same numeric references to facilitate comparison between different figures.

The different parts shown in the figures are not necessarily all at the same scale, in order to make the figures more easily readable.

DETAILED PRESENTATION OF PARTICULAR EMBODIMENTS

Figure 1:
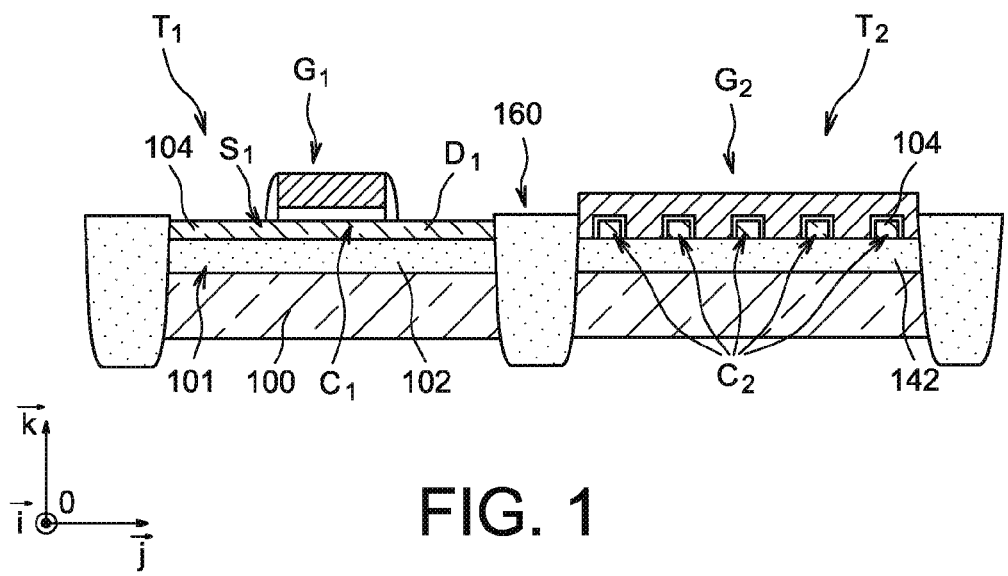
FIG. 1 shows an example of a microelectronic device implemented according to the invention on a semiconductor on insulator substrate, including an adjacent nanowire transistor supported on a first insulating region and a planar gate structure transistor supported on a second insulating region forming part of the insulating layer of said substrate.

FIG. 1 shows a microelectronic device formed from a semiconductor on insulator substrate including a semiconducting support layer 100, a thin insulating layer 101 arranged on and in contact with the semiconducting support layer 100 and a thin semiconducting layer 104 arranged on and in contact with the insulating layer 101.

In a first region of the substrate, a transistor $T_1$ of a given type, for example a MOSFET FDSOI, comprises a channel $C_1$ and source regions $S_1$ and drain regions $D_1$ formed in said thin semiconducting layer 104. The gate $G_1$ of this transistor has a planar structure in the sense that it is in the form of an area extending parallel to the principal plane of the substrate and parallel to the area of the channel $C_1$.

The principal plane of the substrate is defined herein and throughout the remainder of the description as being a plane passing through the substrate and parallel to the [O; $\vec{i}$; $\vec{j}$] plane of the [O; $\vec{i}$; $\vec{j}$; $\vec{k}$] coordinate system shown in FIG. 1.

The area of the channel $C_1$ of the transistor $T_1$ is arranged on and in contact with an area of said insulating layer based on a dielectric material 102 with dielectric constant $k_1$ and separated from the support layer 100 by this area.

The area of the insulating layer 101 separating the channel $C_1$ from the support layer 100 is designed in this example to have a composition and thickness such that capacitive coupling can be set up between the channel $C_1$ and said semiconducting support layer. This coupling may be such that a variation of the potential applied on the layer 100 causes a variation in the threshold voltage $V_{T1}$ of the transistor $T_1$, for example of the order of 100 mV.

The insulating layer 101 may for example be based on $SiO_2$ and its thickness may be less than 20 nm.

In a second region of the substrate separated from the first region by shallow trench isolation STI type trenches 160, a different type of transistor $T_2$ for example a transistor commonly called a "finFET" or of the type commonly called "triGate" comprises a channel $C_2$ formed from a plurality of semiconducting bars or nanowires made by etching said thin semiconducting layer 104, and that are therefore adjacent in a plane parallel to the principal plane of the substrate. The gate $G_2$ of this transistor $T_2$ has an encasing structure and it covers the lateral faces (in this example faces orthogonal to the [O; $\vec{i}$; $\vec{k}$] plane) and the top face of the nanowires (in this example a face parallel to the [O; $\vec{i}$; $\vec{j}$] plane).

The channel $C_2$ of the transistor $T_2$ is arranged on and in contact with a area based on a dielectric material 142 different from the material 102 in the area facing which the first transistor $T_1$ is located with a dielectric constant $k_2$ such that $k_2 > k_1$.

The area of dielectric material 142 separating the channel $C_2$ from the support layer 100 in this example is designed to have a composition and thickness that enable capacitive coupling between this channel $C_2$ and said semiconducting support layer.

The dielectric constant $k_2$ of the dielectric material 142 is greater than the dielectric constant $k_1$ of the dielectric material 102 to enable better capacitive coupling between the channel $C_2$ and the substrate.

The area of the dielectric material 142 may for example be based on $Si_3N_4$ or a high-k type dielectric material such as $HfO_2$ or $HfSiO_xN_y$ with a thickness less than 25 nm or 20 nm.

Capacitive coupling between the channel C2 and the substrate is such that a modulation of the threshold voltage may be applied. Modulation occurs as soon as the order of magnitude of capacitive coupling between the channel and the substrate becomes the same as the order of magnitude of coupling between the gate and the channel, the substrate then acting as a second gate.

Coupling between the channel $C_2$ and the layer 100 may be such that a variation of potential applied on the layer 100 leads to a variation of the threshold voltage $V_{T2}$ of the transistor $T_2$ that can be as high as a few tens of mV, for example 100 mV.

Figure 7:
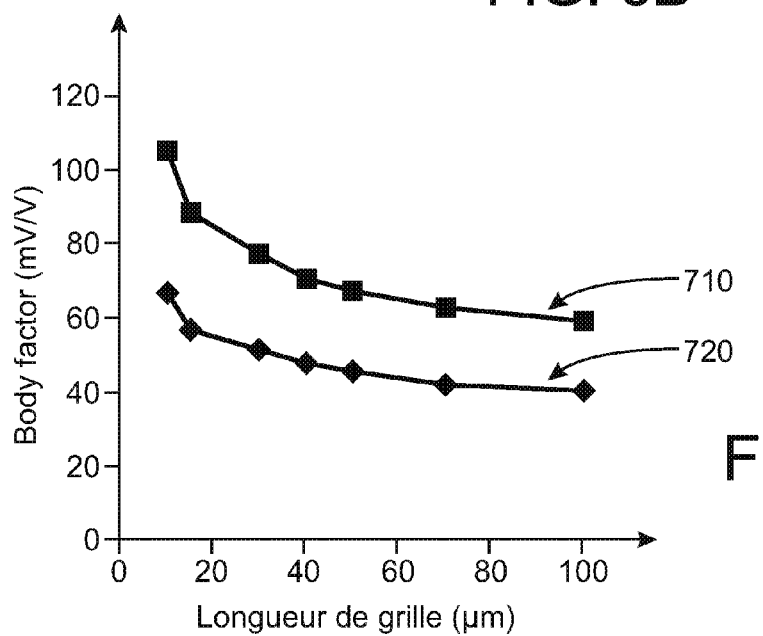
FIG. 7 shows parameter variation curves illustrating a variation of the threshold voltage of a nanowire transistor on a dielectric area of silicon nitride or on a silicon oxide area as a function of its gate length.

FIG. 7 gives an example of a curve 710 of the variation of a parameter commonly called the "body factor" corresponding to a variation of the threshold voltage of a transistor with an arrangement similar to that of transistor $T_2$ but with a single semiconducting bar with a height of the order of 15 nm, a width of the order of 15 nm, depending on a variation of the potential of the layer 100 of the substrate obtained in a case in which the dielectric material 142 is made of silicon nitride with a dielectric constant k=7. For comparison, a curve 720 illustrates the variation of the body factor for this transistor when the dielectric material 142 is replaced by $SiO_2$.

Such a device type may be applied to producing of a high performance low consumption logic circuit.

Figure 2A:
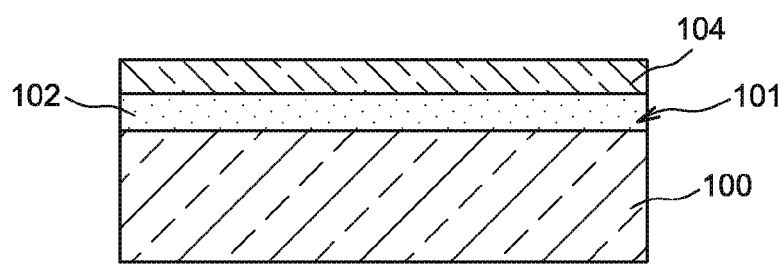
FIGS. 2A-2O, 3A-3L, 4A-4J show an example of a method according to an example embodiment of a microelectronic transistor device provided with at least one nanowire transistor and at least one planar gate structure transistor co-integrated on an SOI substrate.

An example of a method for producing a transistor microelectronic device will be described with reference to FIGS. 2A-2O (in which the device being produced is shown in a cross-sectional view XX'), FIGS. 3A-3L (in which the device being produced is represented in a top view), and FIGS. 4A-4J (in which the device currently being manufactured is shown in a cross-sectional view Y'Y or Z'Z).

The initial material for this method (FIG. 2A) may be a semiconductor on insulator type substrate formed from the support layer 100 based on a semiconducting material, for example silicon, the support layer being covered by the insulating layer 101 based on dielectric material 102 with a dielectric constant $k_1$, for example $SiO_2$, itself covered with the thin semiconducting layer 104.

In particular, the insulating layer 101 may be a thin or ultra-thin layer of the type commonly called "thin-BOX" (Buried Oxide) or "ultra-thin BOX" (UTB), and thus be less than several tens of nanometers thick, or less than 20 nm, for example of the order of 10 nm.

The thin semiconducting layer 104 may for example be based on Ge or SiGe, or Si, particularly with an <100> or <110> orientation and with a thickness that may be less than 20 nm, for example of the order of 12 nm.

In a first region A of the substrate, and particularly of the layer 104, at least one transistor of a given type, for example of the "finFET" or "trigate" type, provided with a channel in the form or several adjacent parallel bars will be made, while in one or several other regions (not shown in FIG. 2A), one or several different types of transistors, for example of the planar gate structure type will be formed.

Firstly, a first mask 106 is formed on the substrate 100 comprising an opening 107 delimiting the first region A and exposing the thin semiconducting layer 104.

Figure 3A:
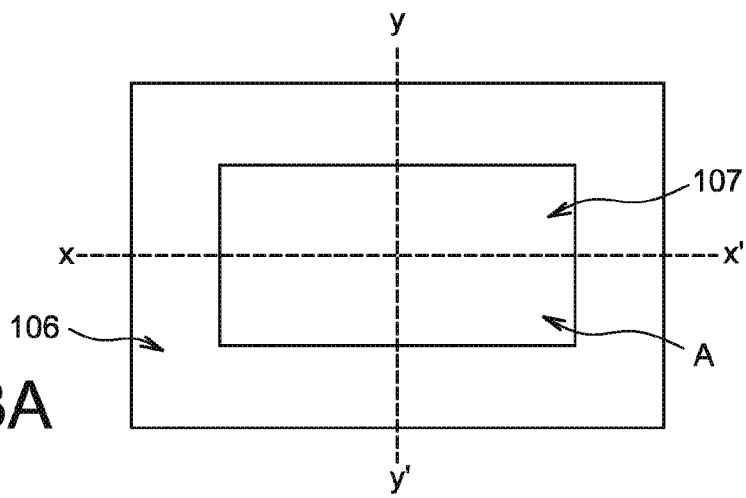
Figure 2B:
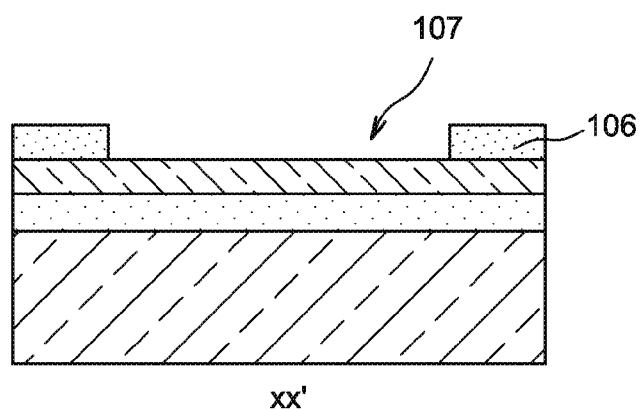

For example, the first mask 106 may be based on silicon nitride and its thickness may for example be between several nanometers and several tens of nanometers, for example of the order of 30 nm (FIGS. 2B and 3A).

Figure 2C:
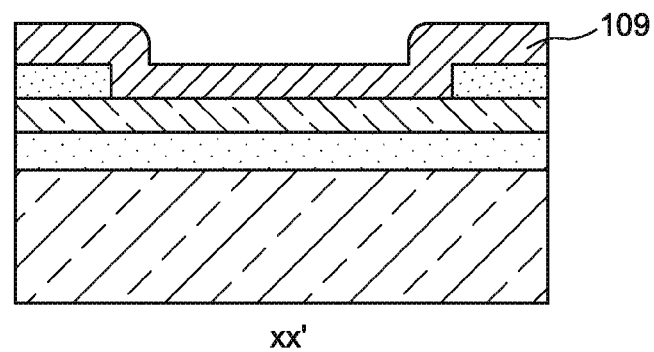
Figure 3B:
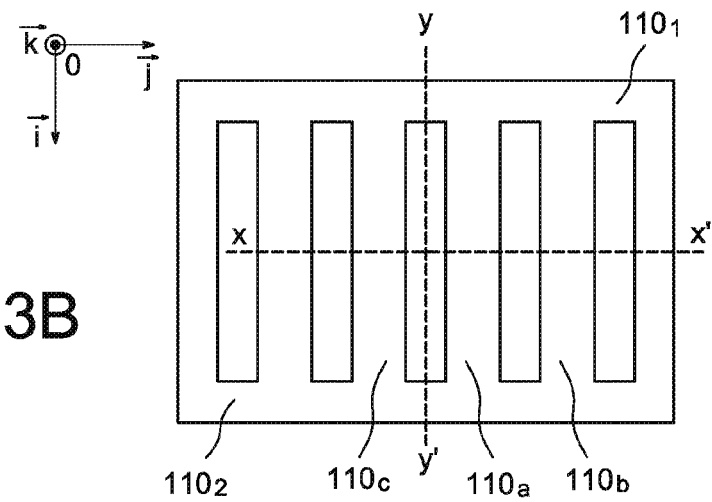

The next step is to form a so-called "hard mask" layer 109, for example based on a metal such as TiN so as to cover the first mask 106 and the first region A of the thin semiconducting layer 104 exposed through the opening 107, in a conforming manner. The thickness of the hard mask layer 109 is between several nanometers and several tens of nanometers, for example of the order of 10 nm (FIG. 2C).

Figure 2D:
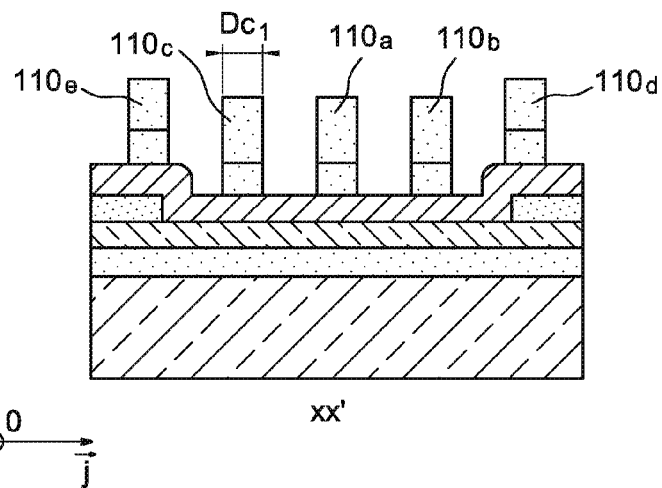
Figure 4A:
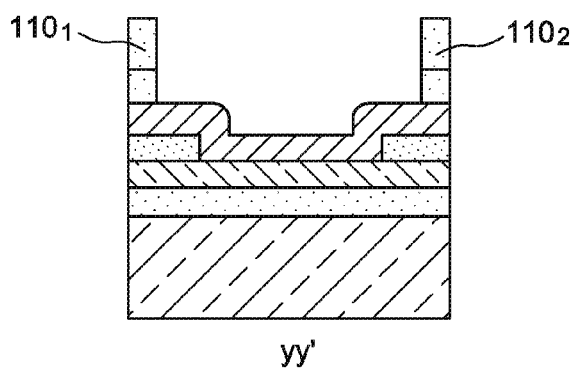

Then (FIGS. 3B, 2D, and 4A), a sacrificial block is made for example by deposition of a stack of a carbon based layer made by SoC (Spin On Carbon) deposition and Si-Arc and a resin that may for example be insolated using an electron beam ("e-beam") that will be etched later.

The sacrificial block is composed of first parallelepiped shaped pads 110a, 110b, 110c, 110d, 110e parallel and adjacent to each other, these first pads extending along a first direction (the first direction in this example being the direction of the vector $\vec{i}$ or the coordinate system [O; $\vec{i}$; $\vec{j}$; $\vec{k}$] given in FIGS. 3B and 2D) parallel to the principal plane of the substrate. The sacrificial block is also composed of two parallelepiped pads $110_1$, $110_2$, joining the ends of the first pads 110a, 110b, 110c, 110d, 110e, and extending along a second direction (in this example the direction of the vector $\vec{j}$), orthogonal to said first direction.

Some pads 110a, 110b, 110c have a portion formed facing the opening 107 of the mask 106 exposing the first region A of the thin semiconducting layer 104, while the other blocks 110d, 110e, $110_1$, $110_2$ are arranged around said first region A and facing the mask 106.

The critical dimension $Dc_1$ of the pads 110a, 110b, 110c, 110d, 110e, $110_1$, $110_2$ forming the sacrificial block may for example be of the order of 20 nm (the critical dimension being defined in this case and throughout this description as being the smallest dimension of an element measured in a plane parallel to the principal plane of the substrate, i.e. parallel to the [O; $\vec{i}$; $\vec{j}$] plane given for example in FIG. 3B).

The next step is to make a conforming deposition of a material 121 that may be dielectric, and for example based on silicon nitride and in particular covers the flanks or side faces of these pads 110a, 110b, 110c, 110d, 110e, and $110_1$, $110_2$. The thickness of the deposited material 121 may for example be of the order of 10 nm.

Figure 3C:
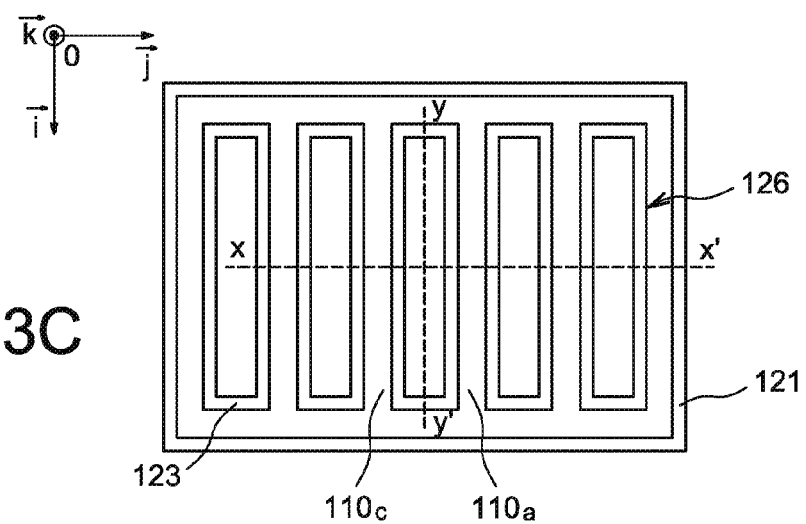
Figure 2E:
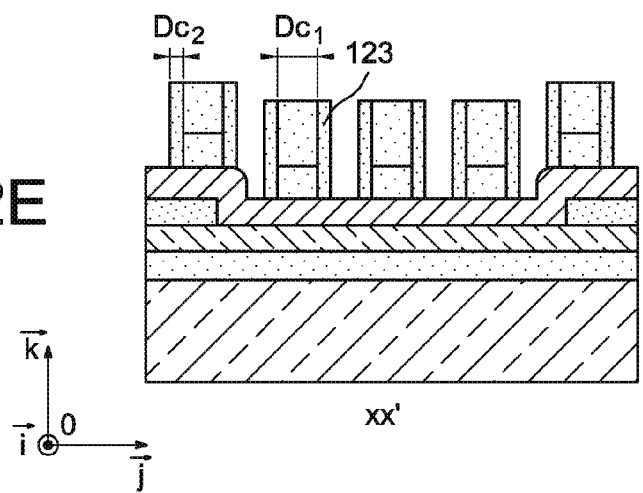
Figure 4B:
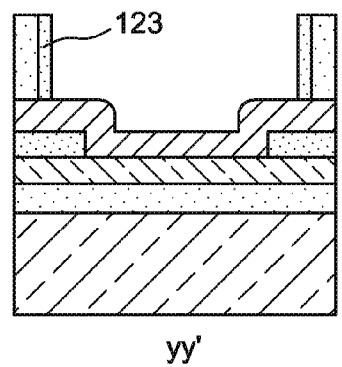

Mask blocks 123 also called "spacers" 123 are formed by partial removal of the material 121 in contact with the side flanks of the sacrificial block and surrounding it. The critical dimension $Dc_2$ of these spacers 123 may for example be of the order of about ten nanometers, less than the critical dimension $Dc_1$ of the pads forming the sacrificial block and that may be approximately equal to the deposited thickness of the material 121 (FIGS. 3C, 2E, 4B). The spacers 123 may be made by etching and stopping on the hard mask layer 109. For example, in this case, in which the spacers 123 are based on nitride and the hard mask layer 109 is based on metal such as TiN, this etching may be done by means for example of a $N_2O_2$ plasma.

Figure 3D:
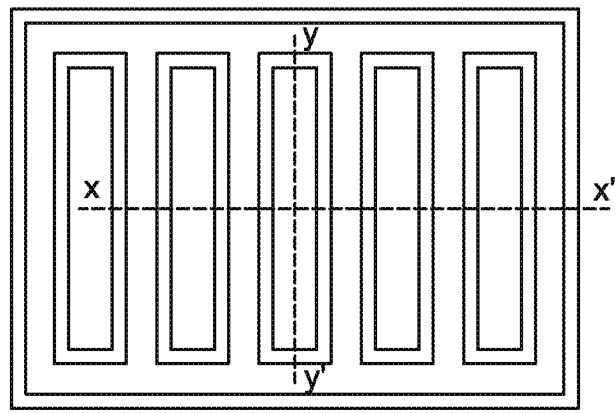
Figure 2F:
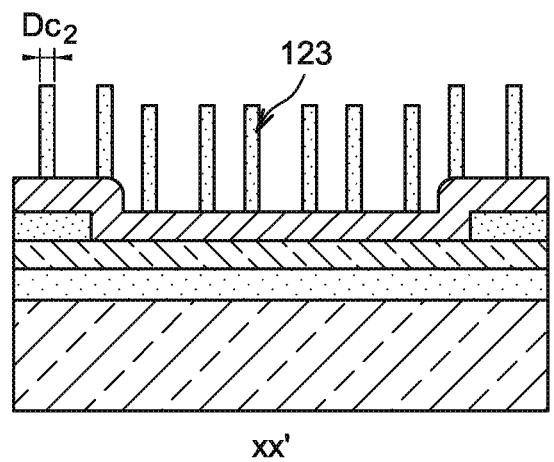
Figure 4C:
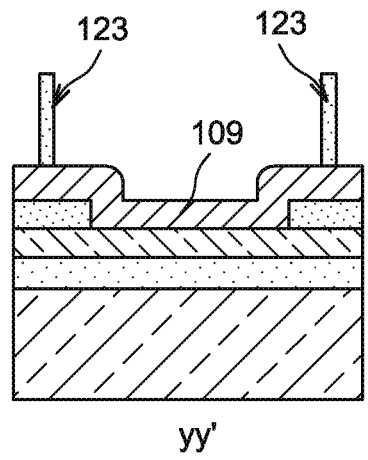

The next step is removal of the sacrificial block, while the spacers 123 are kept (FIGS. 3D, 2F, 4C). $O_2$ plasma etching may be done for this purpose.

Figure 3E:
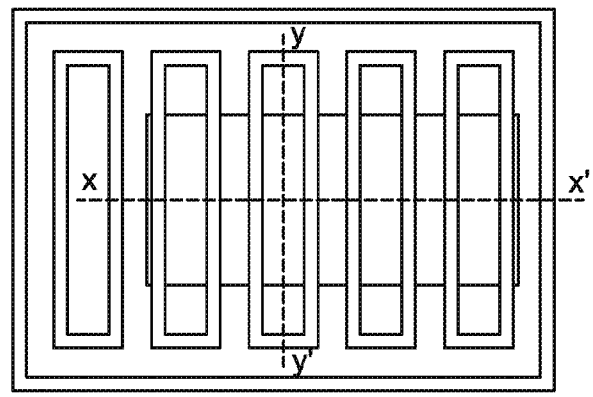
Figure 2G:
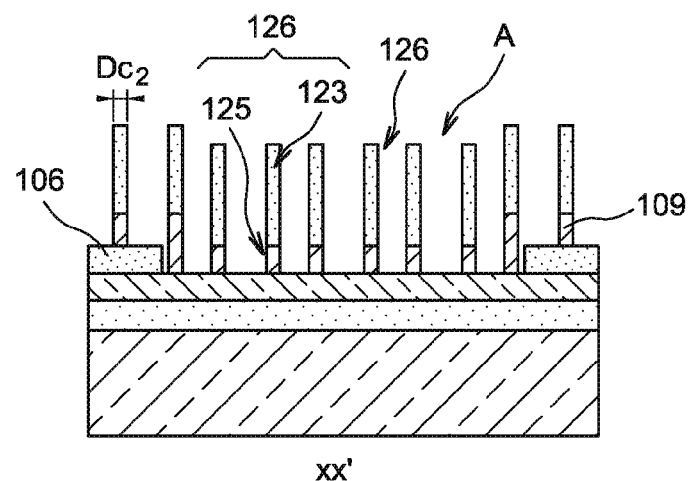
Figure 4D:
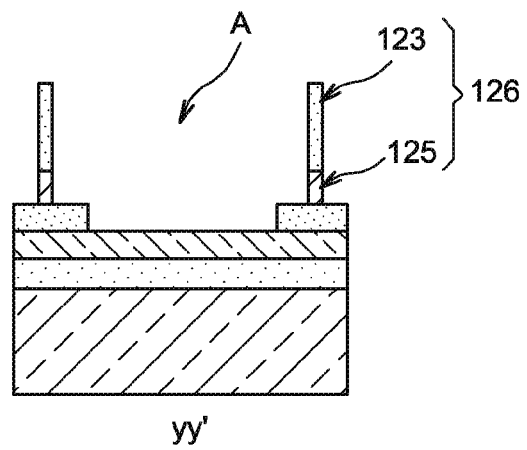
Figure 3F:
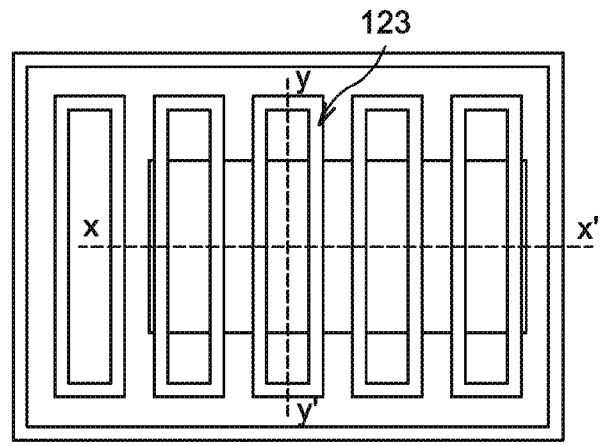

The patterns of spacers 123 in the hard mask layer 109 are then reproduced (FIGS. 3E, 2G, 4D). Thus, hard mask blocks 125 are formed in this layer 109 prolonging the spacers 123. These blocks 125 on which the spacers 123 are supported have dimensions and particularly a critical dimension, equal to approximately $Dc_2$ of the spacers 123. This step may be done using anisotropic etching of the hard mask layer 109, for example using $BCl_3/Cl_2$. This thus exposes the first mask 106 again, together with the first region A of the thin semiconducting layer 104 of the substrate.

The blocks 125 on which the spacers 123 are placed form a second mask 126 arranged above the first mask 106, of which portions are located facing and partially covering the opening 107 of the first mask 106.

Figure 2H:
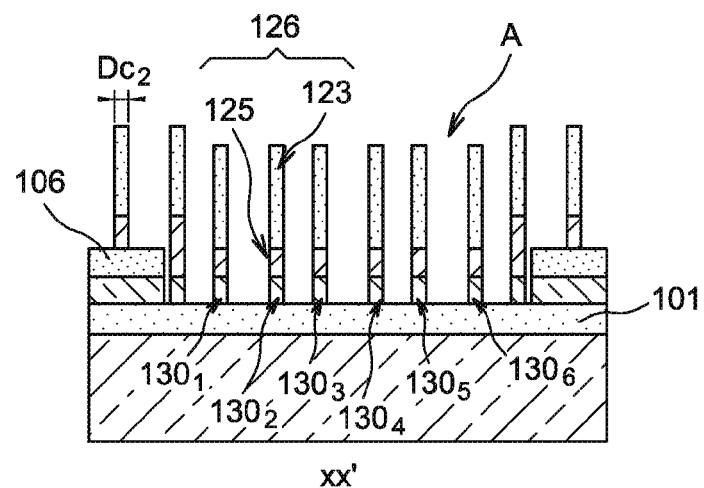
Figure 4E:
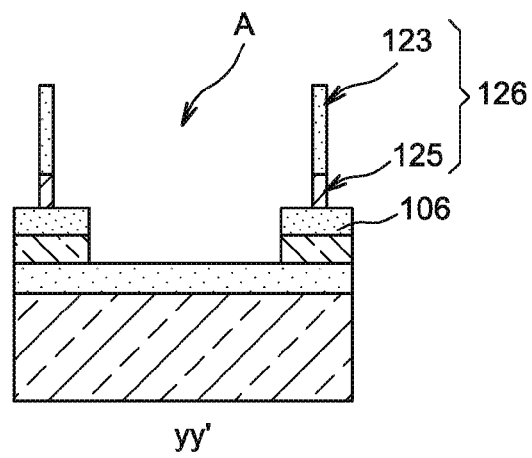
Figure 3G:
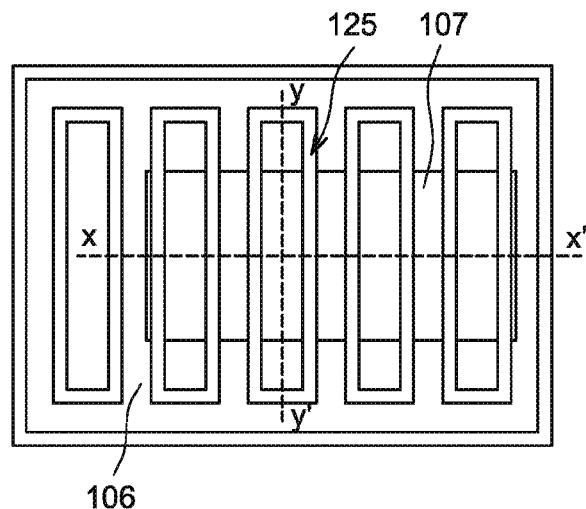

The next step can be to reproduce the patterns of the second mask 126 in the thin semiconducting layer 104 (FIGS. 3F, 2H, 4E), so as to form semiconducting bars $130_1$, $130_2$, $130_3$, $130_4$, $130_5$, $130_6$, also called "wires" (or nanowires if their critical dimension is less than 1 μm), or "fins" with a critical dimension $Dc_3$ less than $Dc_2$. The critical dimension $Dc_3$ of the semiconducting bars $130_1$, $130_2$, $130_3$, $130_4$, $130_5$, $130_6$ can thus be such that $Dc_3 \approx Dc_2$ and is of the order of several nanometers, for example of the order of 10 nm. The adjacent semiconducting bars $130_1$, $130_2$, $130_3$, $130_4$, $130_5$, $130_6$, may be distributed for example at a pitch of the order of 35 nm.

In order to perform this step, anisotropic etching is done through the first mask 106 and the second mask 126 stopping on the thin insulating layer 101 of the substrate. This etching may be done for example using $CF_4$ and $HBr/O_2$.

Figure 2I:
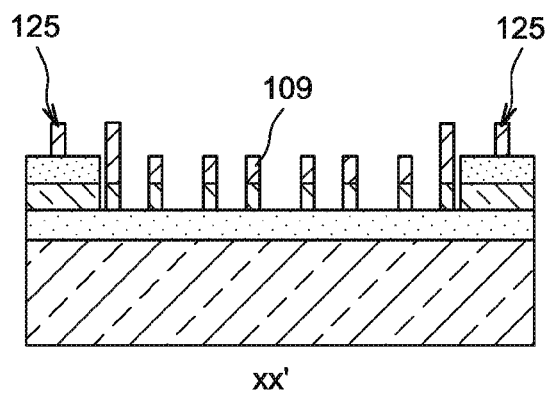
Figure 4F:
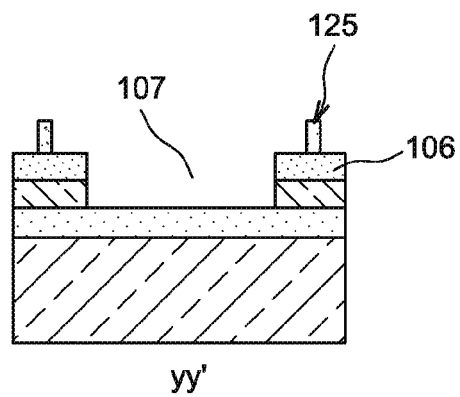

The second mask 126 can then be removed. To achieve this, the spacers 123 can firstly be removed (FIGS. 3G, 2I, 4F), for example by HF etching.

Figure 3H:
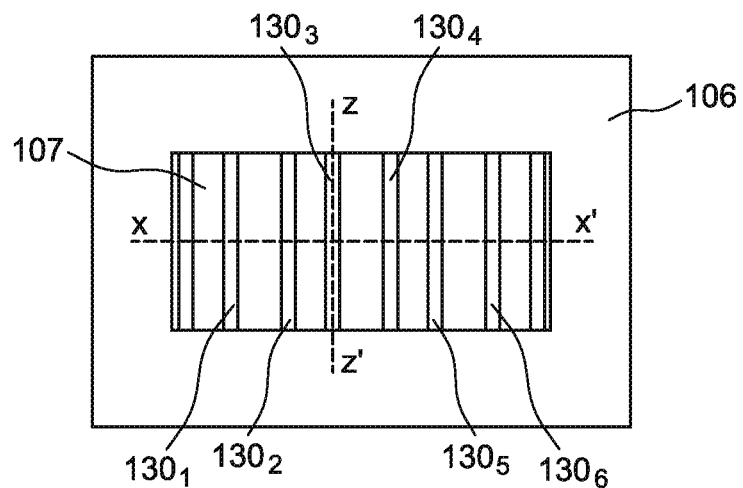
Figure 2J:
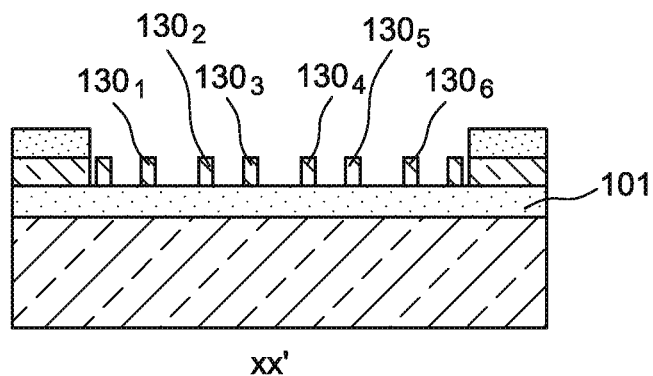
Figure 4G:
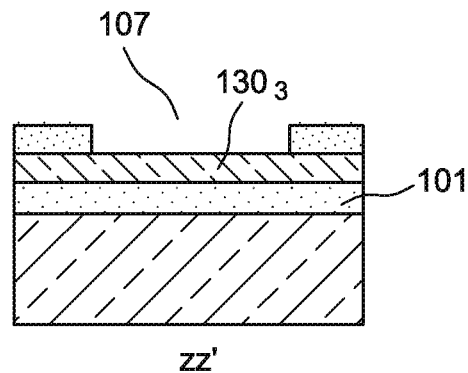

Then (FIGS. 3H, 2J, 4G), FIG. 4G in this case showing a cross sectional view ZZ' shown in FIG. 3H), the blocks 125 are removed from the hard mask layer 109 to keep only the semiconducting bars $130_1$, $130_2$, $130_3$, $130_4$, $130_5$, $130_6$.

Figure 3I:
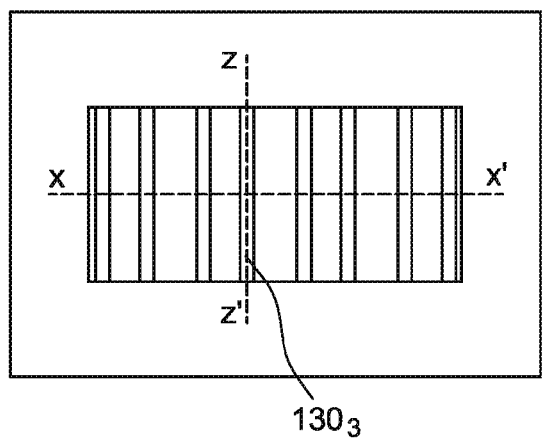
Figure 2K:
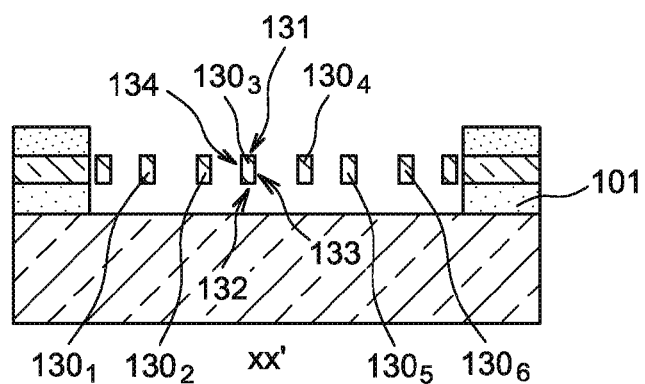
Figure 4H:
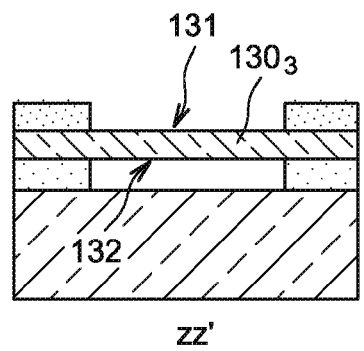

The next step is to remove the thin insulating layer 101 of the substrate facing the first region A and through the opening 107 of the first mask 106 (FIGS. 3I, 2K, 4H). This removal may for example be done by chemical etching using HF. After this removal, a portion of the semiconducting bars $130_1$, $130_2$, $130_3$, $130_4$, $130_5$, $130_6$ located in the first region A is exposed. The semiconducting bars $130_1$, $130_2$, $130_3$, $130_4$, $130_5$, $130_6$ are thus suspended and held in place by areas of the thin semiconducting layer 104 that are not etched and are located outside the first region A delimited by the opening 107 of the first mask 106. The exposed portions of the semiconducting bars $130_1$, $130_2$, $130_3$, $130_4$, $130_5$, $130_6$ have top face 131, bottom face 132 and lateral face 133, 134 exposed in line with opening 107.

Figure 3J:
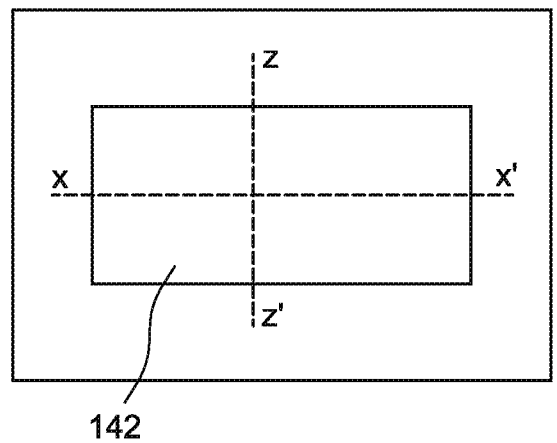
Figure 2L:
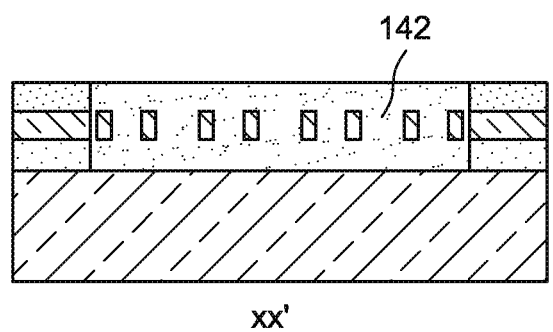
Figure 4I:
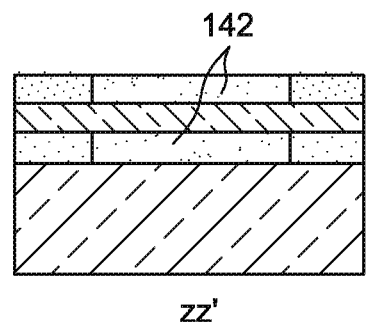

A dielectric material 142 different from the material 102 in the thin insulating layer 101 can then be deposited. The dielectric constant $k_2$ of the dielectric material 142 may in particular be greater than the dielectric constant $k_1$ of the thin insulating layer 101 of the substrate. For example, the deposited dielectric material 142 may be a silicon nitride or a type of material commonly called a "high-k" material. The deposition may possibly be made so as to fill in the opening 107 in the hard mask 106 and possibly surround the semiconducting bars $130_1$, $130_2$, $130_3$, $130_4$, $130_5$, $130_6$. In this case, a polishing step commonly called "planarisation" or CMP (Chemical Mechanical Polishing) is done to remove the dielectric material 142 located above the top face of the first mask 106 (FIGS. 3J, 2L, 4I).

The dielectric material 142 is then partially removed so as to expose the top face 131 and side faces 133, 134, of the semiconducting bars $130_1$, $130_2$, $130_3$, $130_4$, $130_5$, $130_6$.

This partial removal may possibly be done until the top face of the remaining areas of the thin insulating layer 101 is reached corresponding to the level of the bottom face 132 of the bars $130_1$, $130_2$, $130_3$, $130_4$, $130_5$, $130_6$. In this case, the thickness of the area of dielectric material 142 produced under and facing the bars $130_1$, $130_2$, $130_3$, $130_4$, $130_5$, $130_6$. is approximately the same as the thickness of the insulating layer 101.

Figure 3K:
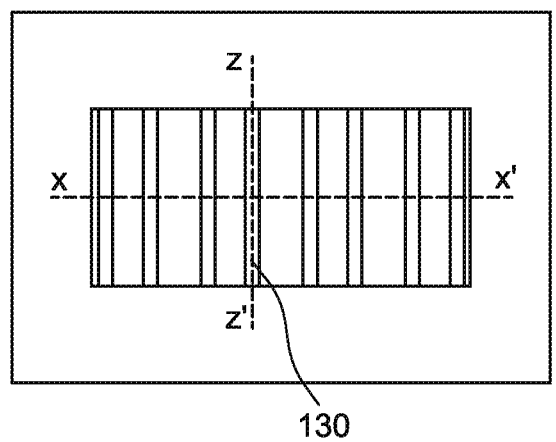
Figure 2M:
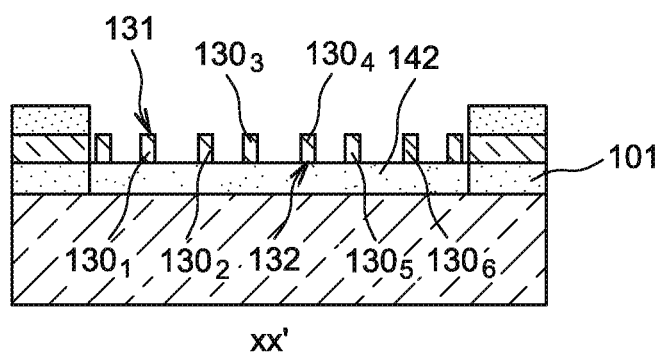
Figure 4J:
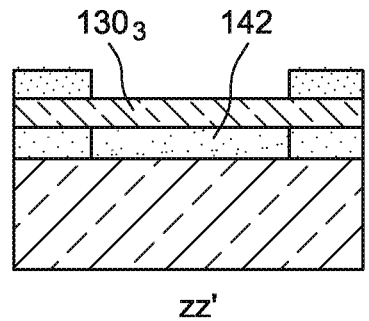
Figure 2N:
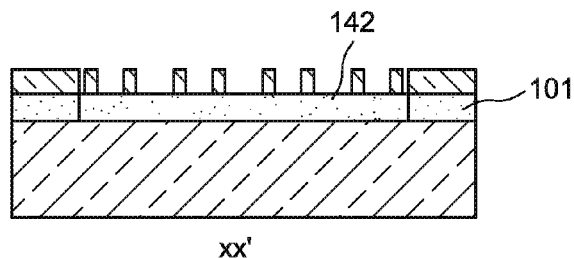
Figure 3L:
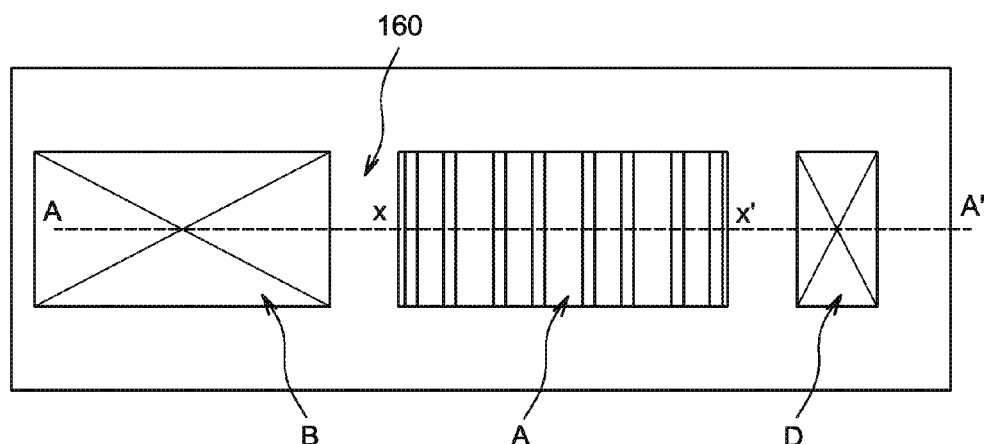
Figure 2O:
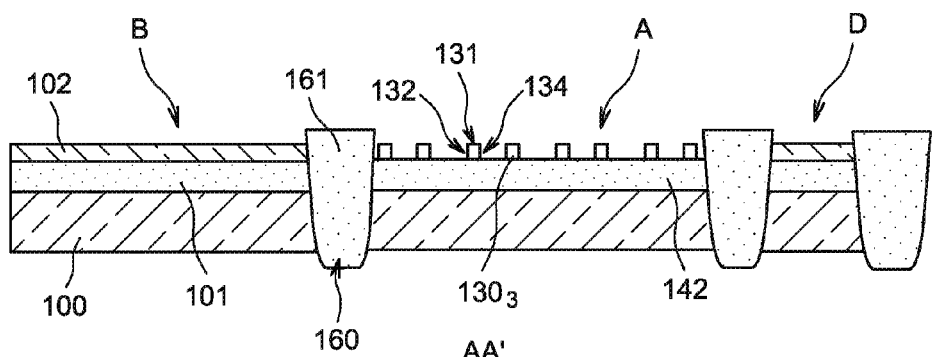

The remaining area of dielectric material 142 then replaces the region of the thin BOX insulating layer 101 that had previously been removed. The area of replacement dielectric material 142 extends particularly along the bars and its thickness and composition are designed to set up capacitive coupling between the substrate 100 and the bars $130_1$, $130_2$, $130_3$, $130_4$, $130_5$, $130_6$. The next step is to remove the first mask 106, for example by HF (FIGS. 2M, 3K, 4J).

The next step is to form isolation areas, for example of the STI type around the first region A and other regions B and D of the thin semiconducting layer 104 in which other transistor structures were made or will be made.

The isolation areas may be made by the formation of trenches 106 around the regions A, B, D, and then by deposition of a dielectric material 161 such as $SiO_2$ in these trenches 160.

FIG. 20 shows a first isolation area that separates the first region A in which the semiconducting bars $130_1$, $130_2$, $130_3$, $130_4$, $130_5$, $130_6$ were made from a second region B in which planar gate structure transistors, for example of the FDSOI type, will be made or are being made.

A second isolation area separates the first region A from a third region D in which one or several other structures or components have been made or will be made.

The steps to deposit a gate dielectric and then a gate material on the semiconducting bars $130_1$, $130_2$, $130_3$, $130_4$, $130_5$, $130_6$ and on the region B of the thin semiconducting layer 104, can then be done followed by etching of this gate dielectric and this gate material.

The result is the formation of transistor gates, and particularly one or several planar type gates that extend parallel to the thin semiconducting layer 104 of the substrate in the second region B and at least one encasing gate arranged around the side faces 133, 134 and on the top face of the semiconducting bars $130_1$, $130_2$, $130_3$, $130_4$, $130_5$, $130_6$.

One variant embodiment is shown in FIGS. 5A-5C and 6A-6B.

For this variant, the initial material may be the semiconductor on insulator type substrate in the previously described example method, formed by the support layer 100 based on semiconducting material covered by the insulating layer 101 based on a dielectric material 102 with a dielectric constant $k_1$, itself covered with the thin semiconducting layer 104.

In a first region A of the layer 104, a given type of transistor, for example a "finFET" or "trigate" type transistor with a channel in the form of adjacent parallel bars will be made, while at least one different type of transistor, for example a planar gate structure type transistor, will be formed in another region B'.

The first step is to form a hard mask layer 201, for example based on a TeOS type silicon oxide, on the thin semiconducting layer 104.

Figure 5A:
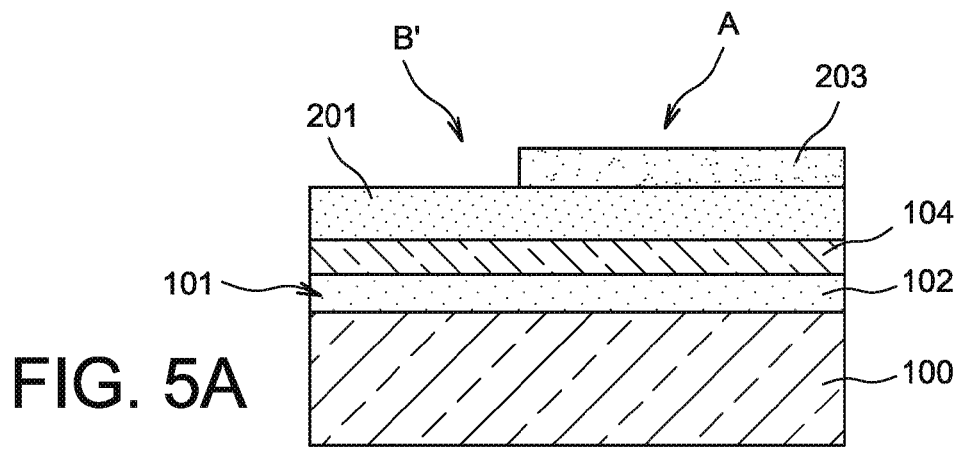
FIGS. 5A-5C, and 6A-6B show an example embodiment of a microelectronic transistor device provided with at least one nanowire transistor on a dielectric area replacing the insulating layer of an SOI substrate of a substrate and at least one other transistor on a semiconducting region replacing the thin semiconducting layer and the insulating layer of the SOI substrate.

A mask 203, for example based on a photosensitive resin facing the first region A of the thin semiconducting layer 104 is then formed on the hard mask layer 203, the other region B' being exposed (FIG. 5A).

The next step is to etch the hard mask layer 201, the thin semiconducting layer 104 and the insulating layer 101 through the mask 203.

Figure 5B:
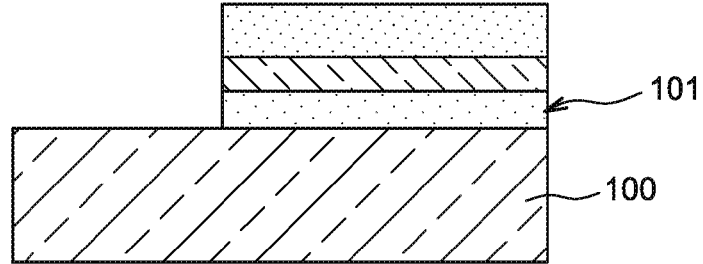

Thus, the insulating layer 101 in the other region B' of the substrate is removed, so as to expose an area of the support layer 101 located in this second region of the semiconductor on insulator type substrate (FIG. 5B).

Figure 5C:
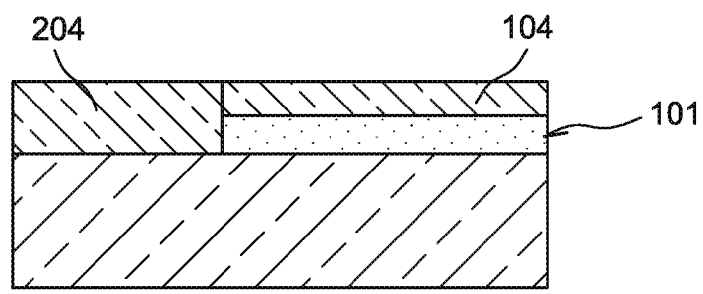

The resin mask 203 can then be removed, and a semiconducting region 204 can then be formed on the exposed area of the support layer 101. This semiconducting region 204 may be made for example by epitaxial growth (FIG. 5C).

In the other region B' of the substrate, the semiconducting region 204 thus forms a modified bulk substrate type region. This thus forms a semiconductor on insulator type substrate that is modified comprising a semiconducting region 204 supported directly on the support layer 100.

Figure 6A:
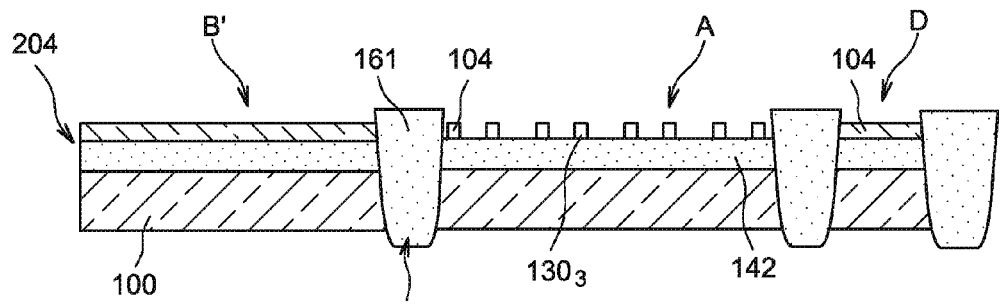

A method like that described above with reference to FIGS. 2A-2O, 3A-3L, 4A-4J can then be used in order to form a transistor channel structure with bars $130_1$, $130_2$, $130_3$, $130_4$, $130_5$, $130_6$ in the first region A (FIG. 6A).

A transistor $T_2$ comprising a channel formed from a plurality of semiconducting bars formed on a area based on dielectric material 142 different from the dielectric material of the insulating layer 101 in the semiconductor on insulator type substrate can then be formed in the first region A.

Figure 6B:
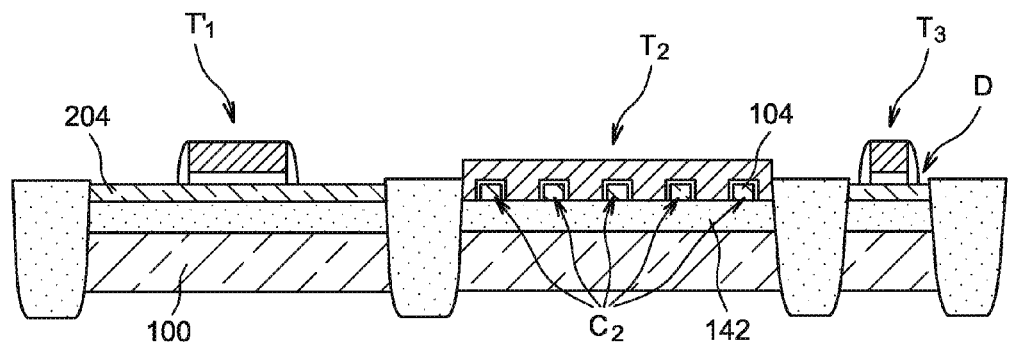

A planar transistor structure T'1 for which the channel structure is located in the semiconducting region 204 is formed in the other region B'. The regions A and B' can be co-integrated with a third region D of the insulating semiconductor substrate of which the insulating layer 101 was kept intact. In this third region, a transistor $T_3$ for which the channel is provided in the thin semiconducting layer 104 of the substrate can be formed (FIG. 6B).

The invention claimed is:

1. A microelectronic device comprising:
   a substrate comprising a thin semiconducting layer supported on an insulating layer, said insulating layer being supported on a semiconducting support layer,
   at least one first transistor of a first type comprising a region suitable for forming a channel, the region comprising one or several adjacent bars, arranged in and/or on said thin semiconducting layer and an encasing gate arranged on said bars and around side faces of said bars, said channel of said first transistor being arranged on an area based on a given dielectric material different from that of said insulating layer,
   the composition and thickness of said given dielectric material facilitating capacitive coupling between said channel of said first transistor and said semiconducting support layer of said substrate and/or said given dielectric material with a dielectric constant $k_2$ such that $k_2 > k_1$, where $k_1$ is the dielectric constant of the insulating layer material.

2. The microelectronic device according to claim 1, comprising at least one other transistor, the channel area of which is formed in a semiconducting region arranged on and in contact with the semiconducting support layer of the substrate.

3. The microelectronic device according to claim 1, said area of said insulating layer being based on $SiO_2$ and being less than 20 nm thick.

4. The microelectronic device according to claim 3, comprising at least a second transistor of which the channel area is formed in a region of the thin semiconducting layer arranged on and in contact with the insulating layer of the substrate.

5. The microelectronic device according to claim 4, the thickness and composition of said insulating layer facilitating a capacitive coupling between the channel of said second transistor and said semiconducting support layer of said substrate.

* * * * *